United States Patent
Yang et al.

(10) Patent No.: US 11,829,214 B2
(45) Date of Patent: Nov. 28, 2023

(54) DEVICE COOLING

(71) Applicant: Microsoft Technology Licensing, LLC, Redmond, WA (US)

(72) Inventors: Chien Lung Yang, Sammamish, WA (US); Matthew Gen, Kirkland, WA (US); Todd Chiles, Redmond, WA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 0 days.

(21) Appl. No.: 17/714,425

(22) Filed: Apr. 6, 2022

(65) Prior Publication Data
US 2023/0324965 A1    Oct. 12, 2023

(51) Int. Cl.
| G06F 1/20 | (2006.01) |
| F16C 11/04 | (2006.01) |
| H05K 7/20 | (2006.01) |
| G06F 1/16 | (2006.01) |

(52) U.S. Cl.
CPC .............. *G06F 1/203* (2013.01); *F16C 11/04* (2013.01); *G06F 1/1681* (2013.01); *H05K 7/20136* (2013.01)

(58) Field of Classification Search
CPC ........ G06F 1/203; G06F 1/1681; F16C 11/04; H05K 7/20136
See application file for complete search history.

(56) References Cited

U.S. PATENT DOCUMENTS

| 5,125,378 A * | 6/1992 | Westerbeke, Jr. ....... F01P 11/08 |
| | | 181/204 |
| 5,186,793 A * | 2/1993 | Michaels ............. B01D 53/326 |
| | | 204/278 |
| 5,738,023 A * | 4/1998 | Mennink ................. F24H 8/003 |
| | | 110/309 |
| 5,832,987 A | 11/1998 | Lowry et al. |
| 5,880,929 A | 3/1999 | Bhatia |
| 6,253,834 B1 | 7/2001 | Sterner |
| 6,507,488 B1 | 1/2003 | Cipolla et al. |
| 6,771,498 B2 | 8/2004 | Wang et al. |
| 7,457,113 B2 | 11/2008 | Kumhyr et al. |
| 9,148,979 B2 | 9/2015 | Chiriac et al. |
| 10,429,105 B1 * | 10/2019 | Kariya ................. F25B 29/003 |

(Continued)

FOREIGN PATENT DOCUMENTS

| CN | 2687583 Y | 3/2005 |
| WO | 2017205919 A1 | 12/2017 |

OTHER PUBLICATIONS

"Method for Enhanced Cooling of Microprocessor Components in a Multiple Server Configuration Utilizing Vortex Tubes", In Journal of IP.com, Dec. 28, 2001, 5 Pages.

(Continued)

*Primary Examiner* — Michael A Matey
(74) *Attorney, Agent, or Firm* — Rainier Patents, P.S.

(57) ABSTRACT

The description relates to devices and air cooling of devices. One example can include a heat generating component positioned in a housing and a temperature-based gas separation assembly configured to receive ambient air and to separate the ambient air into warmer air that is directed outside the housing and cooler air that is directed inside the housing to cool the heat generating component.

20 Claims, 8 Drawing Sheets

(56) References Cited

U.S. PATENT DOCUMENTS

| | | | | |
|---|---|---|---|---|
| 2002/0168556 | A1* | 11/2002 | Leboe | H01M 8/04014 |
| | | | | 429/423 |
| 2002/0179286 | A1* | 12/2002 | Sterner | F28D 15/02 |
| | | | | 257/E23.099 |
| 2005/0160752 | A1 | 7/2005 | Ghoshal et al. | |
| 2005/0237714 | A1* | 10/2005 | Ebermann | H05K 7/20754 |
| | | | | 361/695 |
| 2006/0056994 | A1* | 3/2006 | Van Lear | F04D 25/04 |
| | | | | 257/E23.098 |
| 2006/0114653 | A1 | 6/2006 | Seto et al. | |
| 2008/0271598 | A1* | 11/2008 | Daniels | C01B 21/0438 |
| | | | | 96/9 |
| 2009/0279258 | A1 | 11/2009 | Moore et al. | |
| 2012/0083196 | A1* | 4/2012 | Mockridge | H05K 7/20745 |
| | | | | 454/239 |
| 2013/0301214 | A1* | 11/2013 | Bohm | G06F 1/20 |
| | | | | 361/709 |
| 2013/0340449 | A1* | 12/2013 | Kozu | F24F 3/147 |
| | | | | 62/271 |
| 2014/0346781 | A1* | 11/2014 | Airoldi | F03D 1/00 |
| | | | | 290/55 |
| 2015/0054284 | A1* | 2/2015 | Nathan | F24S 20/20 |
| | | | | 126/714 |
| 2015/0286256 | A1* | 10/2015 | Delano | G06F 1/203 |
| | | | | 361/679.48 |
| 2018/0307282 | A1* | 10/2018 | Allin | G06F 1/20 |
| 2018/0352676 | A1* | 12/2018 | Degner | H05K 7/20154 |
| 2020/0149430 | A1* | 5/2020 | Cornet | F01D 25/20 |
| 2021/0215401 | A1 | 7/2021 | Gopala Krishnan et al. | |

OTHER PUBLICATIONS

"International Search Report and Written Opinion Issued in PCT Application No. PCT/US23/011489", dated May 3, 2023, 13 Pages.

* cited by examiner

DEVICE COOLING

BACKGROUND

Many devices include heat generating components to achieve their intended functionality. For instance, a notebook computer includes a processor, memory/storage, and a battery to provide computing functionality. Thermal management of heat produced during operation of the heat generating components can impose constraints on the device architecture and/or on performance of the heat generating components.

BRIEF DESCRIPTION OF THE DRAWINGS

The accompanying drawings illustrate implementations of the concepts conveyed in the present document. Features of the illustrated implementations can be more readily understood by reference to the following description taken in conjunction with the accompanying drawings. Like reference numbers in the various drawings are used wherever feasible to indicate like elements. Further, the left-most numeral of each reference number conveys the FIG. and associated discussion where the reference number is first introduced. Where space permits, elements and their associated reference numbers are both shown on the drawing page for the reader's convenience. Otherwise, only the reference numbers are shown.

SUMMARY

This patent relates to devices and air cooling of devices. One example can include a heat generating component positioned in a housing and a temperature-based gas separation assembly configured to receive ambient air and to separate the ambient air into warmer air that is directed outside the housing and cooler air that is directed inside the housing to cool the heat generating component.

This summary is intended to provide the reader with a very brief introduction to some of the concepts contained in this document and is not intended to be inclusive or limiting.

DESCRIPTION

The present concepts relate to cooling devices that include heat generating components. Heat generating components can entail processors, batteries, storage, memory, transformers, etc. The heat generating components can be cooled by gases, such as air, moving over the heat generating components. Heat (e.g., thermal energy) from the heat generating components can be transferred to the air and moved away from the heat generating components to cool them. The efficiency of this cooling process tends to be more efficient with cooler air (e.g., a larger delta between the temperature of the air used for cooling and the temperature of the heat generating component).

The present concepts can offer technical solutions to separate the air available for cooling the heat generating components into a warmer stream and a cooler stream. The cooler stream can be used to cool the heat generating components (e.g., used for cooling) and the warmer stream can be discarded (e.g., directed away from the heat generating components).

Figure 1A:
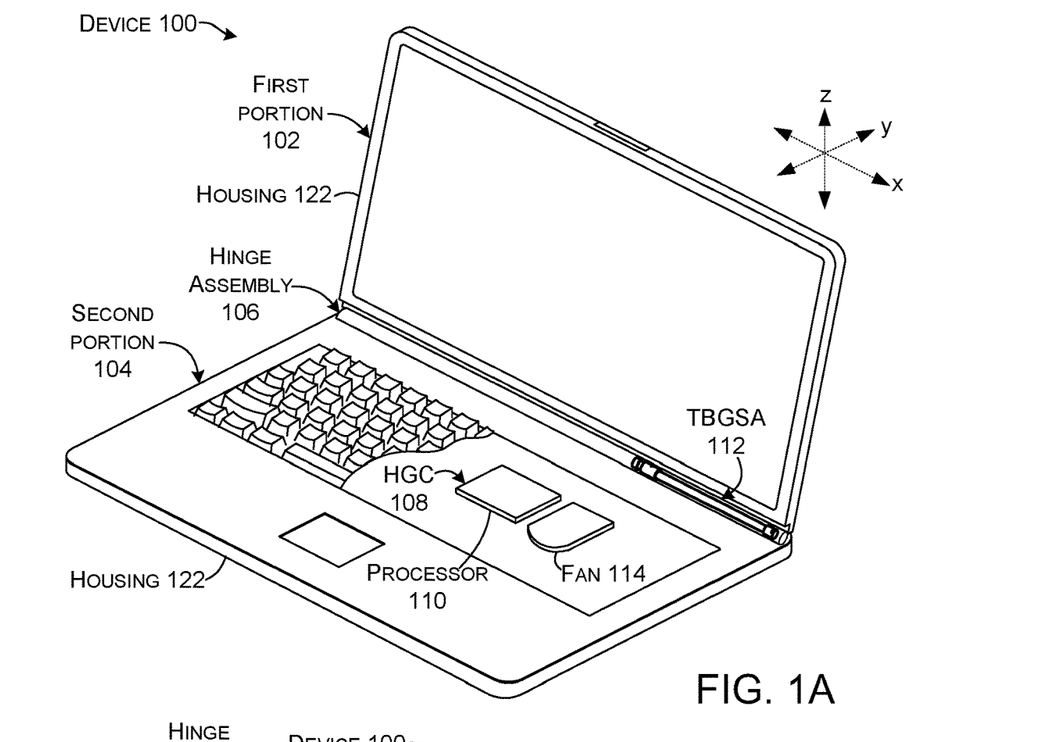
FIGS. 1A and 3A show perspective views of example devices in accordance with some implementations of the present concepts.
Figure 1B:
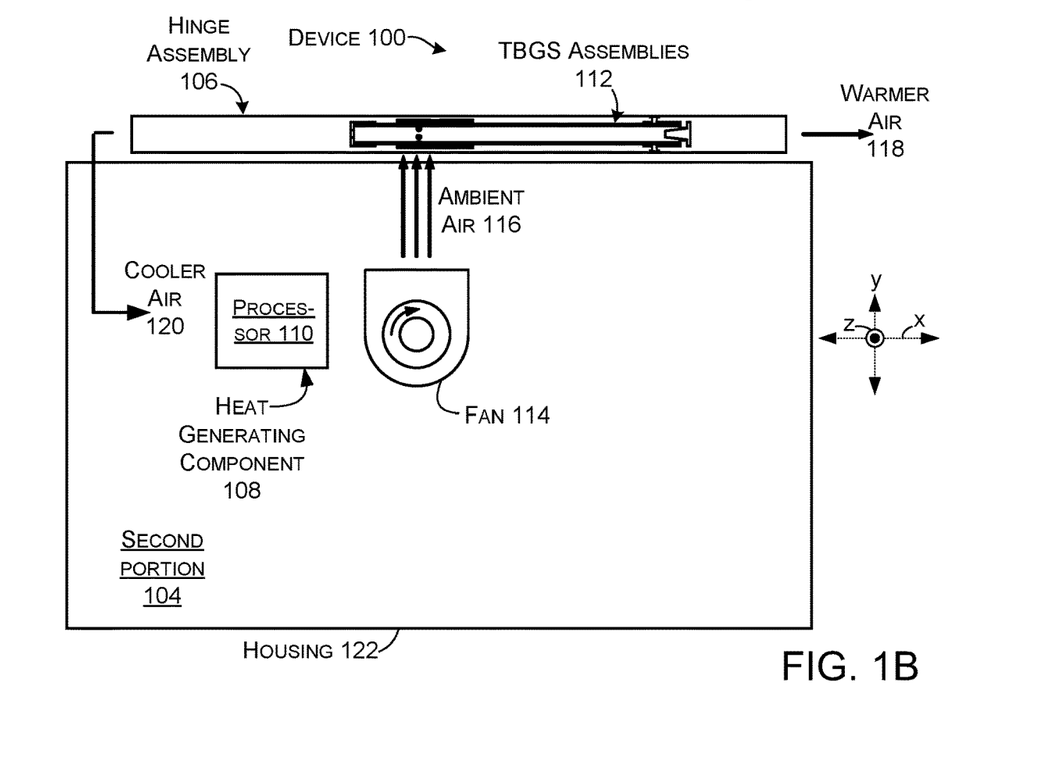
FIGS. 1B, 3F, and 5 show elevational views of example devices in accordance with some implementations of the present concepts.

Introductory FIGS. 1A-1B show an example device 100 that can employ some of the present cooling concepts. In this example, the device includes first and second portions 102 and 104 that are rotatably coupled by a hinge assembly 106. In this case, input devices can be included on both the first and second portions. For instance, touch displays can be positioned on both the first portion and the second portion. Alternatively, a (touch) display can be positioned on the first portion and a mechanical keyboard can be positioned on the second portion, for example.

The device 100 can include one or more heat generating components (HGC) 108 in one or both of the first and second portions 102 and 104. In this case, the heat generating component 108 is manifest as a processor 110. Other example heat generating components can include, batteries, transformers, inverters, memory, storage, etc. The heat generating components 108 can be cooled by one or more temperature-based gas separation assemblies (TBGSA) 112 that can operate cooperatively with fans 114. In this example, a single temperature-based gas separation assembly 112 is positioned in the hinge assembly 106. The fan 114 and the heat generating component 108 are positioned in the second portion 104.

The fan 114 can supply intake or inflow air 116 to the temperature-based gas separation assembly 112. The intake air 116 can be sourced from the inside of the device 100 and/or from the environment around the device. In either the former or the latter case the intake air can be at ambient pressure. The 'intake air' can also be considered 'ambient air' that is forced by the fan 114 toward the temperature-based gas separation assemblies 112. The force imparted by the fan 114 can cause the intake air or ambient air 116 delivered to the temperature-based gas separation assembly 112 to be at greater than ambient pressure.

The temperature-based gas separation assembly 112 can separate the intake or ambient air 116 into a stream of warmer air 118 and a stream of cooler air 120. The warmer air 118 can have a higher temperature than the intake air 116 while the cooler air 120 can have a lower temperature than the intake air 116. The warmer air 118 can be directed out of the device (e.g., expelled into the environment). The cooler air 120 can be directed toward the heat generating component 108.

Traditionally, the heat generating component 108 would be cooled with the ambient air 116. Efficiency of the cooling process can be affected by a temperature differential between the operating temperature of the heat generating component and the cooling air (e.g., the ambient air in traditional solutions). For a given airflow rate and volume, a larger temperature differential can remove/transfer heat more efficiently than a smaller temperature differential between the operating temperature of the heat generating component and the air used for cooling.

The present concepts provide a technical solution that can separate the ambient air (or any air or any gas) into a warmer stream and a cooler stream. The cooler stream can be used as the cooling air and offers a larger heat differential compared to the ambient air in relation to the operating temperature of the heat generating components. The technical solution can be accomplished with the temperature-based gas separation assemblies 112 introduced relative to FIGS. 1A and 1B, which illustrate one implementation employing a single temperature-based gas separation assembly 112. Two other example implementations that employ multiple temperature-based gas separation assemblies 112 are described below relative to FIGS. 2A and 2B.

Figure 2A:
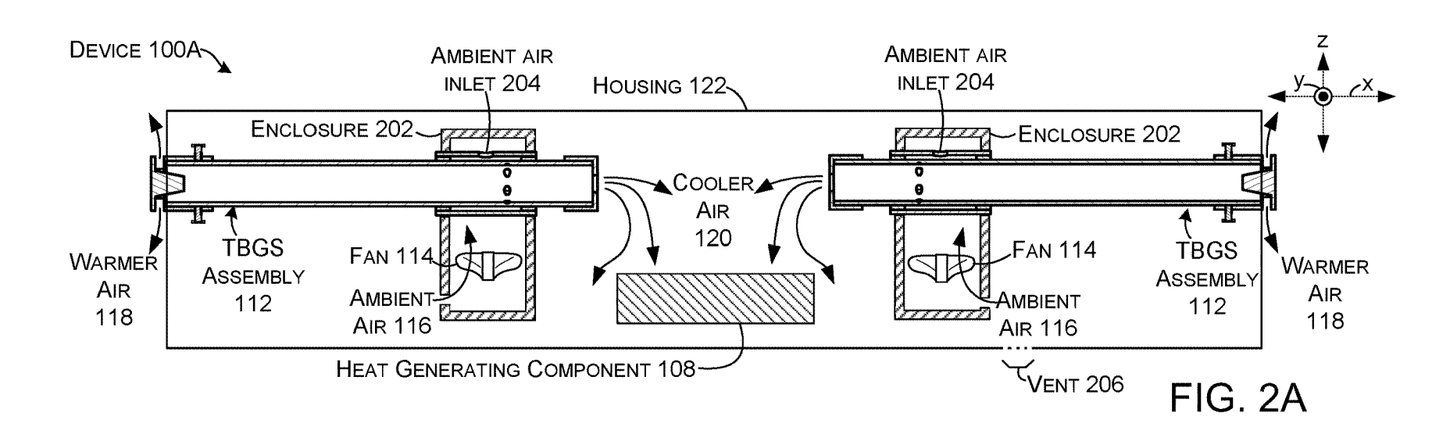
FIGS. 2A, 2B, 3D, 4B, and 4D show sectional views of example devices in accordance with some implementations of the present concepts.
Figure 2B:
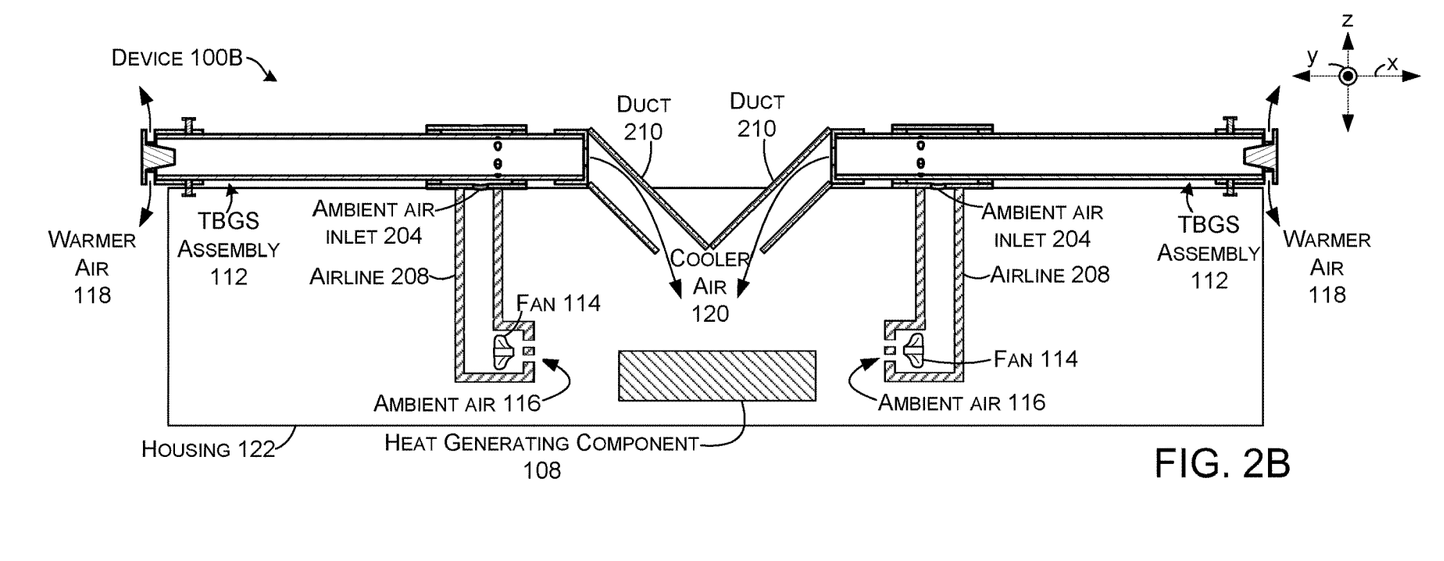

In the illustrated implementation of FIGS. 1A and 1B, the first and second portions 102 and 104 can include or define housings 122. In this configuration, the heat generating component 108 is positioned in the housing 122 and the temperature-based gas separation assembly 112 is positioned in the hinge assembly 106. Alternative configurations are contemplated. For instance, FIG. 2A shows an implementation where both the heat generating component 108 and the temperature-based gas separation assemblies 112 are positioned in the housing 122. FIG. 2B shows an implementation where the temperature-based gas separation assemblies 112 are positioned outside of (e.g., external to) the housing 122.

In the illustrated implementation of FIGS. 1A and 1B, hinge assembly 106 can be viewed as providing a dual functionality technical solution. The hinge assembly can provide a hinge functionality to allow the first and second portions to rotate through a range of orientations. The hinge functionality may be manifest as a friction hinge that can maintain the orientation between the first and second portions unless the user rotates them to a different orientation. The hinge assembly 106 can also provide the temperature-based air separation functionality. The temperature-based air separation functionality can provide cooler air 120 for cooling the heat generating component 108. The cooler air 120 can be cooler than the separated warmer air 118 and cooler than ambient air 116 in and/or around the device. The cooler air 120 enhances the device's thermal capacity which allows device real estate dedicated to thermal management to be decreased and/or for the device to be operated at higher performance levels.

FIG. 2A shows another example device 100A. In this case, the device 100A is manifest as a server computer. Other example devices could be manifest as desktop computers, notebook computers, game consoles, and/or amplifiers, among others. In this example, the device includes housing 122 and the heat generating component 108 is positioned in the housing. In this implementation, two temperature-based gas separation assemblies 112 are positioned relative to the heat generating component in the housing 122.

Fans 114(1) and 114(2) are associated with temperature-based gas separation assemblies 112(1) and 112(2), respectively. In this implementation, the fans 114 are configured to deliver pressurized air to the temperature-based gas separation assemblies 112. In this case the fans 114 are positioned in enclosures 202 that are sealed around ambient air inlets 204 of the temperature-based gas separation assemblies 112. The fans 114 can pull in ambient air 116 and force (e.g., pressurize) this air and deliver it to the temperature-based gas separation assemblies 112 at the ambient air inlets 204.

The temperature-based gas separation assemblies 112 can separate the ambient air delivered by the fans 114 into warmer air 118 and cooler air 120. The warmer air 118 can be directed outside of the housing 122. The cooler air 120 can be directed into the housing and toward the heat generating component 108. The cooler air 120 can cool the heat generating component 108 by heat transfer from the heat generating component 108 to the cooler air 120.

This heat transfer warms the cooler air 120 as it travels over, or proximate to, the heat generating component 108. The cooler air 120 is thus heated by the thermal transfer from the heat generating component 108. This 'warmed' cooler air can now be evacuated (e.g., vented) from the housing 122 or allowed to circulate within the housing where it may once again be drawn into the fans 114 as 'intake air' or 'ambient air' 116. The process can then repeat (e.g., cycle).

The housing 122 may also include or define an intake vent 206 to allow air to enter the housing to replace the warmer air 118 that is exhausted from the housing 122. The ambient air 116 can be external air drawn from outside of the housing and/or 'warmed' cooler air 120 as described above. The vent 206 can be spaced away from the exhaust location of the warmer air 118 to avoid pulling the warmer air 118 back into the housing 122.

In the illustrated implementation of FIG. 2A, the temperature-based gas separation assemblies 112 are positioned within the housing 122. FIG. 2B shows an alternative implementation where the temperature-based gas separation assemblies 112 can be positioned outside of the housing 122 on device 100B. In such a configuration, the fans 114 can force air into the temperature-based gas separation assemblies 112 and the cooler air 120 can be directed back into the housing to cool the heat generating components 108. In this case, the fans 114 are configured in a gas sealed relationship to the ambient air inlets 204 by airlines 208. The fans 114 are configured to draw in ambient air and deliver it to the ambient air inlets 204 via the airlines 208. The temperature-based gas separation assemblies 112 are configured to separate the ambient air into warmer air 118 that can be directed away from the device and cooler air 120 that can be directed back into the device (and potentially toward heat generating component 108 by ducts 210).

Note that the example illustrations show the temperature-based gas separation assemblies 112 either internal to the housing or external to the housing 122, other configurations are contemplated. For instance, the temperature-based gas separation assemblies 112 could be partially in the housing and partially external to the housing.

For devices with heat generating components, thermal management is a challenge because it impacts the quality of system performance, noise, user experience, reliability and even power consumption. This is especially true for space constrained devices, such as portable devices, which are represented by the notebook computer of FIGS. 1A and 1B. Thermal management is also especially problematic for high performance devices, such as those employing very fast and/or powerful processors that generate large amounts of heat. Without efficient thermal management, to avoid overheating, the performance of the device may have to be reduced/throttled to limit heat production.

Air cooling tends to involve directing 'cooling' air over the heat generating component and transferring heat from the heat generating component to the air. The thermal efficiency of this process is affected by the temperature differential between the air used for cooling (e.g., the air directed over the heat generating component) and the operational temperature of the heat generating component. A smaller differential can be compensated with higher air flow rates and/or volumes. However, as mentioned above, in many device configurations, designing for higher flows and/or volumes requires increased volume within the device and that increased volume is then unavailable for other device functionalities and/or the size of the device has to be increased. This creates a technical problem in that neither of these solutions are desirable. Users tend to prefer smaller devices and higher performance.

The present concepts provide a technical solution to this technical problem by providing cooler air for cooling the heat generating components. This technical solution can be achieved without actually cooling the air. Instead, the technical solution can separate the cooler air from warmer air. The warmer air can be discarded and the cooler air can be directed toward the heat generating component. This technical solution can be achieved with temperature-based gas separation assemblies 112. One such example temperature-based gas separation assembly 112 is described in more detail below relative to FIGS. 3A-3F.

FIGS. 3A-3F collectively illustrate an example temperature-based gas separation assembly 112. In this case the temperature-based gas separation assembly 112 includes a main body 302, a cool air cap 304, an ambient air housing 306, and a warm air adjuster 308. In this case, the main body 302 is generally cylindrical, though other shapes, such as a narrowing or widening profiles are contemplated. The cool air cap 304 and the warm air adjuster 308 are positioned on opposing ends of the main body 302.

Figure 3A:
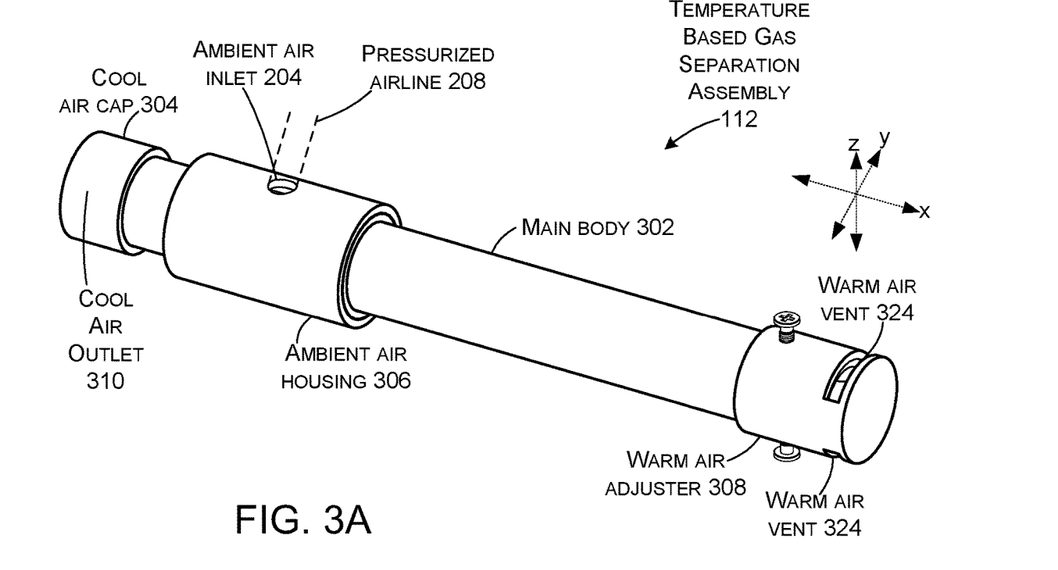
Figure 3B:
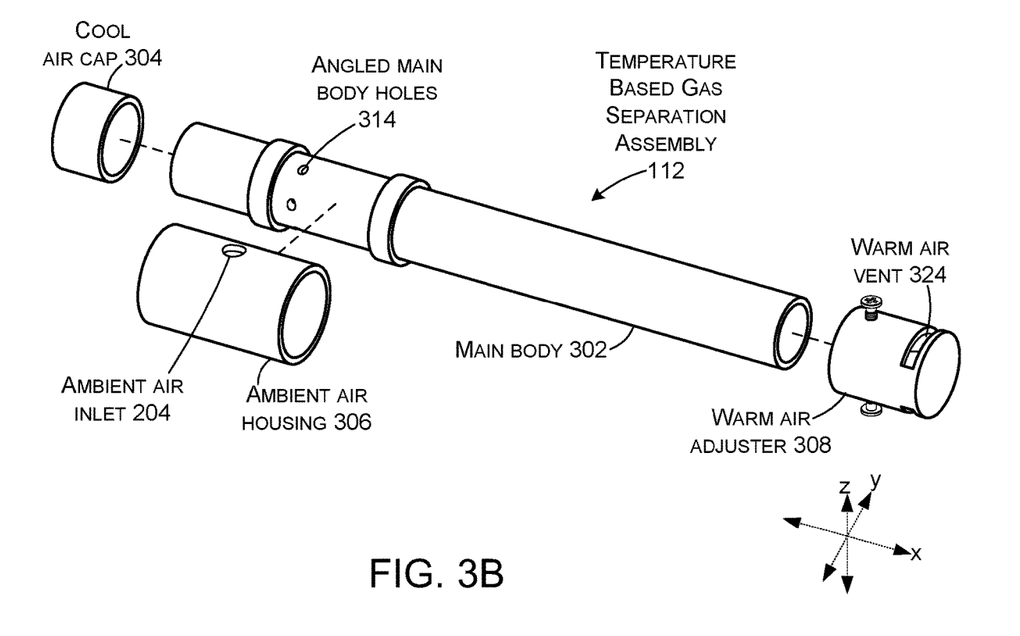
FIG. 3B shows an exploded perspective view of an example device in accordance with some implementations of the present concepts.
Figure 3C:
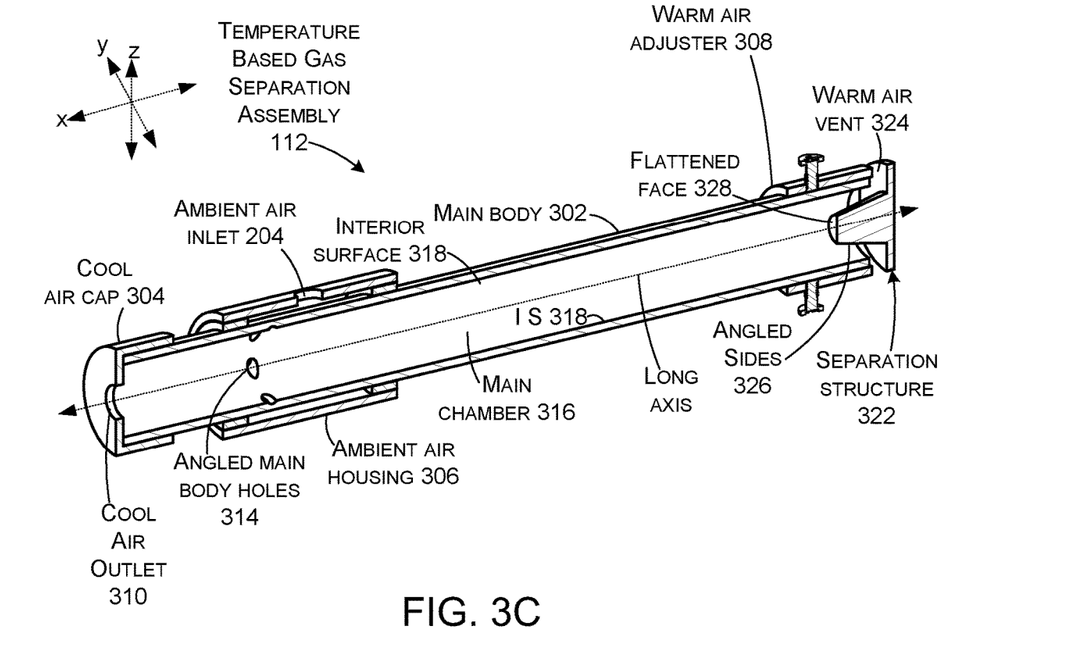
FIGS. 3C, 3E, 4A, and 4C show sectioned perspective views of example devices in accordance with some implementations of the present concepts.
Figure 3D:
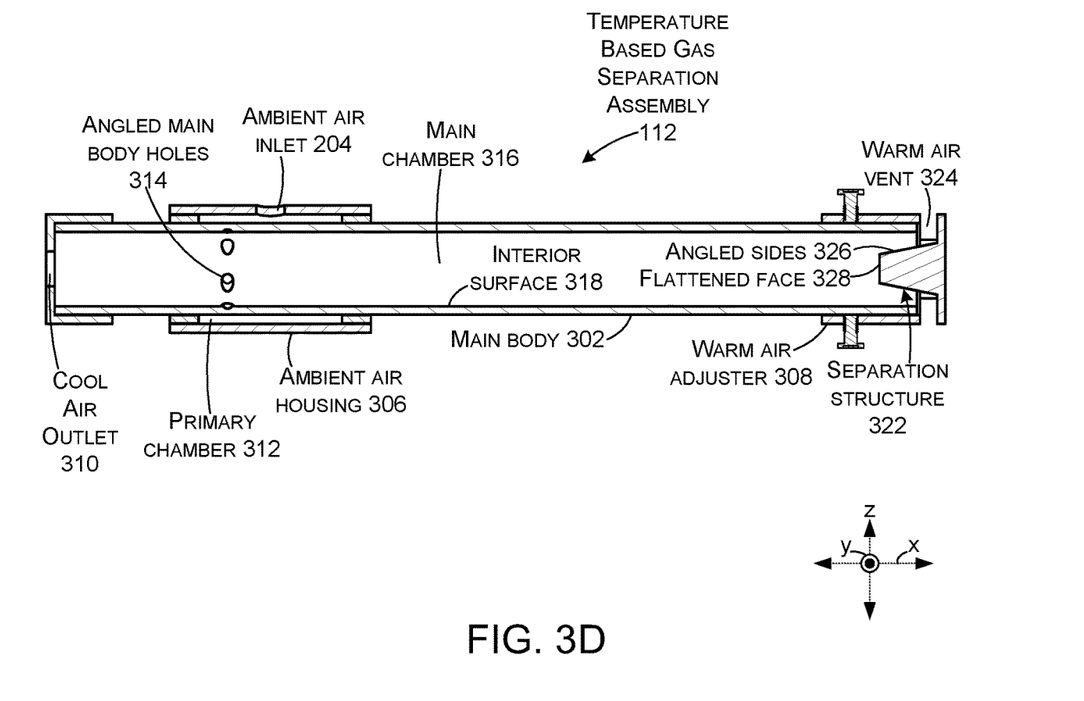
Figure 3E:
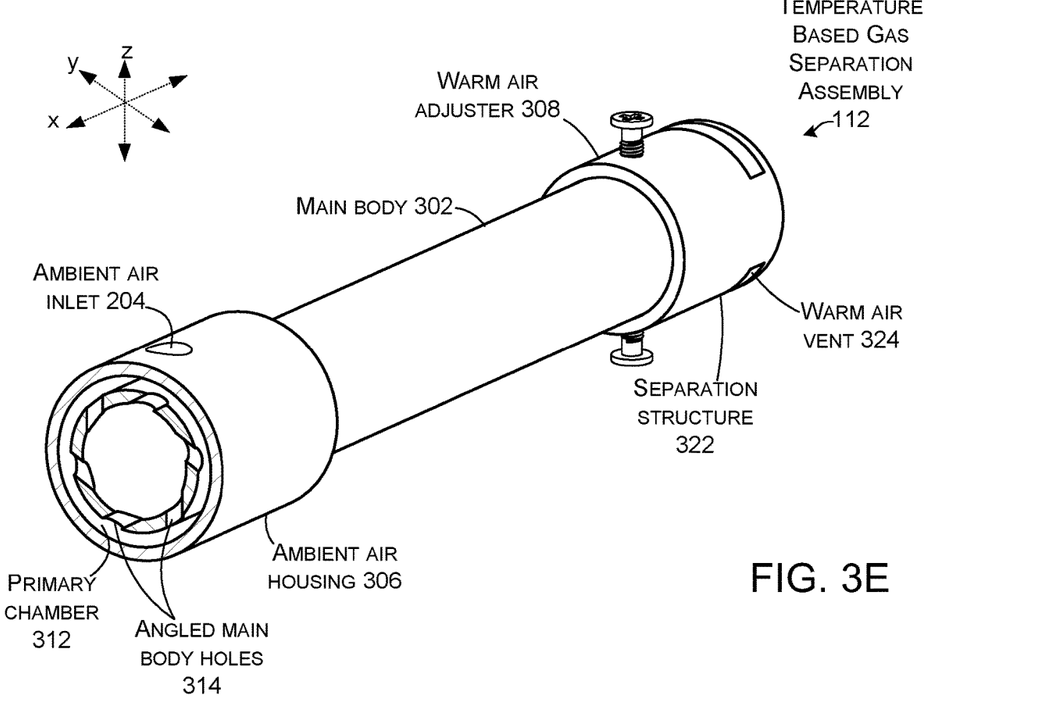

The cool air cap 304 includes a centered cool air outlet 310 (FIGS. 3C and 3D). The ambient air housing 306 is oversized on the main body 302 and sealed at its ends to define a primary chamber 312 (FIGS. 3C and 3D) between the ambient air housing 306 and the main body 302. The ambient air housing 306 can define ambient air inlet 204. The ambient air inlet 204 can receive pressurized or forced air from fan 114, such as via pressurized airline 208 (FIG. 3A). Pressurized air from the airline 208 can fill the primary chamber 312.

Figure 3F:
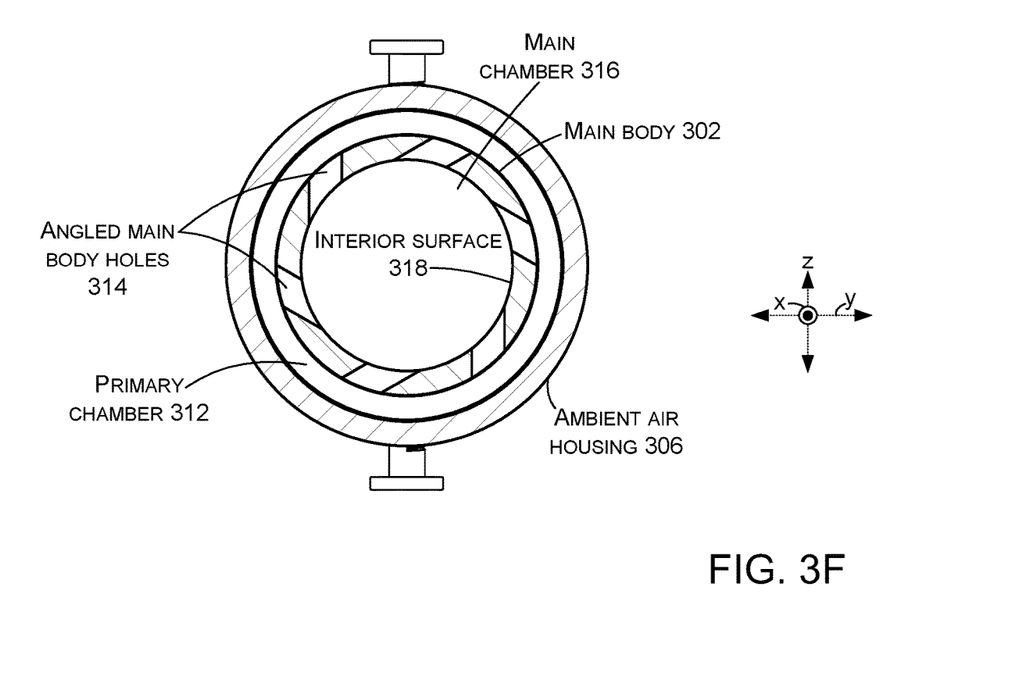

As shown in FIG. 3F, within the primary chamber 312, the main body 302 can define one or more angled main body holes 314 (not all of which are designated with specificity) that lead from the primary chamber 312 to a main chamber 316 defined by the main body 302. The angled main body holes 314 can be positioned along a length of the main body 302 between the opposing ends (e.g., at an interim portion or position). In this case, multiple angled main body holes 314 are positioned (or arranged) radially around the main body 302 at a location that is spaced away from both ends of the main body. The angled main body holes 314 can also be spaced away from the ambient air inlet 204. This configuration can provide a technical solution that promotes pressurization of the primary chamber 312 and relatively even airflow through individual angled main body holes 314. The angled main body holes 314 can be configured to cause air passing from the primary chamber 312 into the main chamber 316 to rotate around an interior surface 318 of the main body 302. This aspect will be discussed in more detail below relative to FIGS. 4A-4D.

The warm air adjuster 308 can include a separation structure 322 and warm air vents 324. In this case, the separation structure 322 has the shape of a conical frustum. The conical frustum shape can include angled sides 326 that extend from the warm air vents 324 to a flattened face 328. The flattened face 328 can be positioned in the center of the main body 302 and be bounded by the angled sides which extend toward the warm air vents 324. Stated another way, a focus of the flattened face 328 can be intersected by, and oriented generally perpendicularly to, a long axis of the main body 302. For instance, as used here, generally perpendicularly can include about +/- ten degrees, for example. In the illustrated configuration, the flattened face is planar, but other shapes, such as concave can be employed. The angled sides 326 can extend from a perimeter of the flattened face 328 to the warm air vents 324. In this example, the angled sides 326 of the conical frustum are linear. In other configurations, the angled sides 326 could be curved or sloped, such as in a convex or concave configuration. The degree of curve could be steady or could change along the length of the angled sides.

The temperature-based gas separation assembly 112 is configured to separate warmer air 118 from cooler air 120. The warmer air can be emitted from the warm air vents 324. The cooler air 120 can be emitted from the cool air outlet 310. Qualitatively, the warmer air 118 will be warmer than the ambient air 116 received at the ambient air inlet 204 and the cooler air 120 will be cooler than both the ambient air 116 and the warmer air 118. These relative temperatures have been verified experimentally and test results are described below relative to FIGS. 5 and 6. The discussion directly below relates to models that explain the temperature separation provided by the temperature-based gas separation assembly 112. As mentioned, the efficacy of the temperature-based gas separation assemblies 112 has been established quantitatively via testing and does not rely on the accuracy of the models.

Figure 4A:
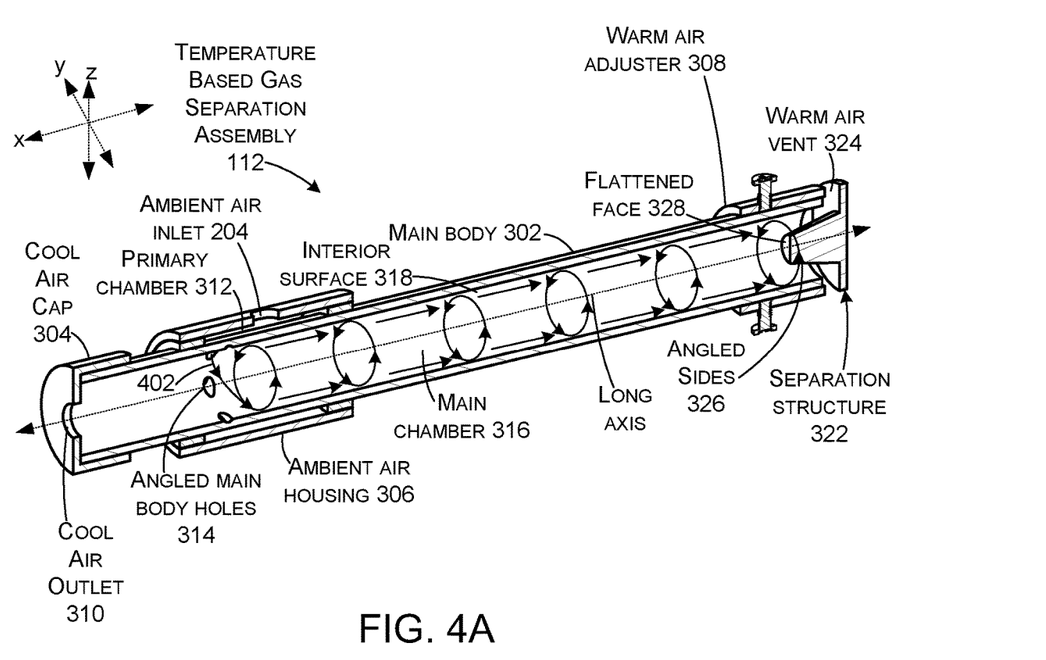
Figure 4B:
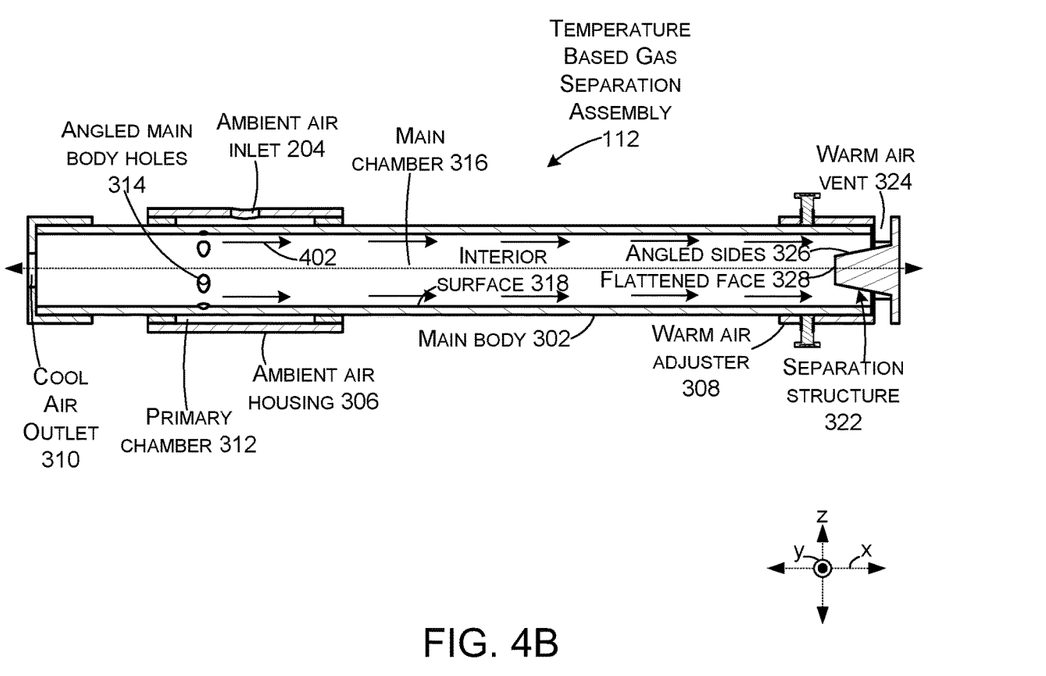
Figure 4C:
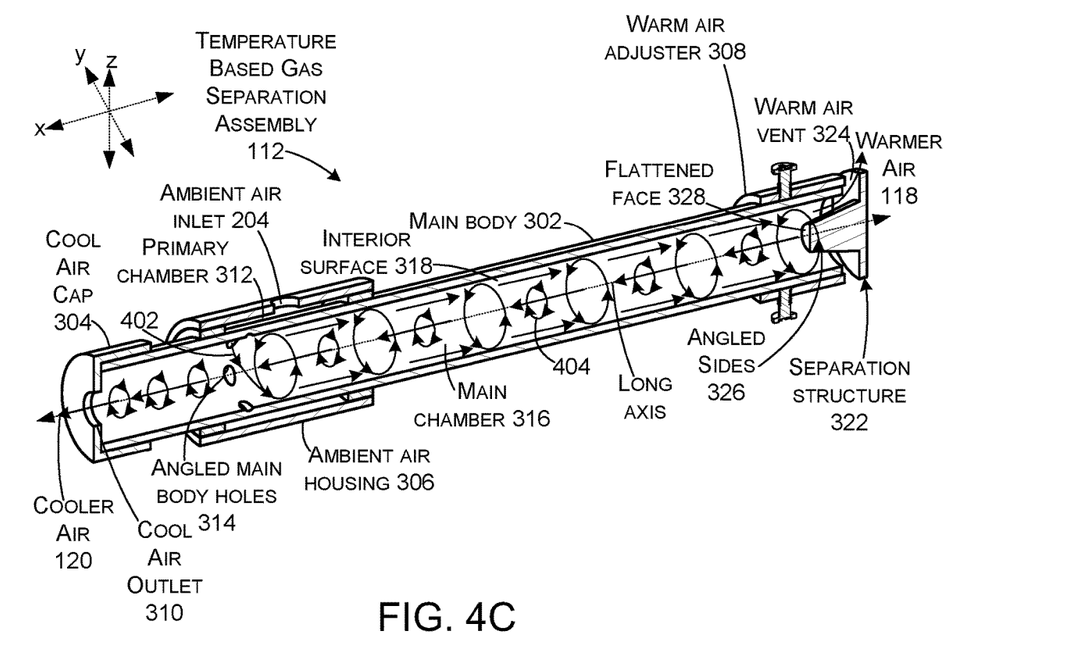
Figure 4D:
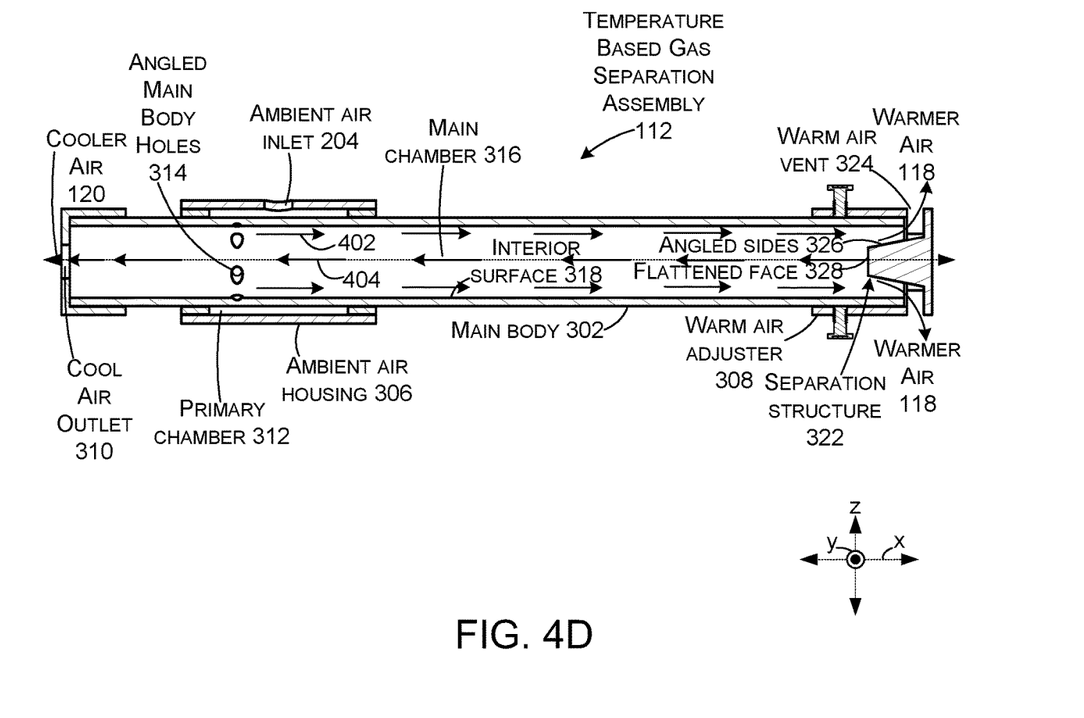

FIGS. 4A-4D collectively illustrate an example model explanation for separating gases by temperature. FIGS. 4A and 4C are similar to FIG. 3C. FIGS. 4B and 4D are similar to FIG. 3D.

Starting with FIGS. 4A and 4B, pressurized ambient air from the primary chamber 312 passes through angled main body holes 314 into the main chamber 316. At this point, the air is represented by arrows 402. The angled nature of the angled main body holes 314 can provide a technical solution by causing the air to enter the main chamber 316 along a path that is generally tangential to the long axis of the main body. The air can contact the interior surface 318 and follow a curved or helical path toward the separation structure 322. Thus, the technical solution offered by the angled main body holes 314 can promote swirling rotation of the incoming air around the interior surface. The radial distribution of the angled main body holes 314 can also contribute to this swirling rotation. In FIG. 4A, the helical path is represented by a circular component (e.g., circular arrows) and a component parallel to the long axis (e.g., the linear arrows). As the air moves toward the separation structure 322, warmer air tends to rotate along a helical path having a larger radius (e.g., along the interior surface 318), while cooler air tends to rotate along a helical path having a smaller radius (e.g., between the long axis and the warmer air).

FIGS. 4C and 4D show that as the rotating air contacts the separation structure 322, the warmer air that is rotating closer to the interior surface 318 continues unimpeded into the separation structure 322 and progresses along the angled sides 326 toward the warm air vents 324. Ultimately, this warmer air 118 exits (e.g., is radially released) from the temperature-based gas separation assembly 112 at the warm air vents 324. In contrast, the relatively cooler air is rotating in relatively smaller circles which tend to contact the flattened face 328. Thus, the separation structure 322 provides a technical solution for separating air based upon temperature. The warmer air 118 that is closer to the interior surface 318 contacts the angled sides 326 and progresses towards and out the warm air vents 324. The cooler air rotating closer to the long axis contacts the flattened face 328 and rebounds.

This cooler air represented by arrows 404 rebounds away from the separation structure 322 in a counter-rotation back along the long axis of the main body 302. The counter-rotating small radius spiral of cooler air can travel within the air traveling toward the separation structure along the interior surface 318. As such, the cooler air can travel around the long axis for the length of the main body 302 and emerge from the cool air outlet 310 which can be centered on the long axis (e.g., the cooler air can be released or emitted coextensive with the long axis). Thus, ambient air enters the main chamber 316 and the air tends to separate based upon temperature such that warmer air 118 is emitted from one end and the cooler air 120 is emitted from the opposite end. The separation structure 322 and the cool air cap 304 provide an additional technical solution to promote the separation based upon temperature. The separation structure 322 is positioned at one end of the main chamber 316 and is configured to promote the migration of warmer air out around the periphery at the warm air vents 324. The cool air cap is positioned at the opposite end to promote temperature-based separation along the length of the main body. Further, the cool air outlet 310 is positioned along the long axis where the cooler air is rotating so that cooler air can exit but warmer air is retained.

From another perspective, the ambient air enters the main chamber 316 through the angled main body holes 314. The ambient air can enter substantially tangentially to the long axis and the air velocity can be high so that the air spins inside the main body 302 against the interior surface 318. As the air rotates it moves toward the separation structure 322. The air may be heated due to friction between the moving air and the interior surface 318. This warmer air encounters the angled sides 326 of the separation structure 322 and migrates out of the warm air vents 324. Other air closer to the long axis contacts the flattened face 328 and bounces back and moves toward the cool air cap 304. As this air moves along the long axis of the main body 302 the air temperature drops until it is emitted as cooler air from the cool air outlet 310. The warmer air 118 is warmer than the ambient air 116. The cooler air 120 is cooler than both the ambient air 116 and the warmer air 118.

The capability to separate gases, such as air into a warmer stream and a cooler stream is a technical solution that enables several advantageous thermal management solutions that are not otherwise available. For instance, lower temperature cooling air (e.g., air available for cooling heat generating components) can provide a technical benefit of increasing the thermal head room. Increased thermal head room can allow heat generating components, such as processors, to be run at higher performance levels and/or can allow less device real estate to be dedicated to thermal management. Note that this technical solution can provide a cool air stream with less energy than previous solutions (e.g., air conditioning).

Given the explanation above, angled main body holes 314 can have any angle that promotes the air entering the main chamber 316 to contact the interior surface 318 and rotate along the interior surface. In some implementations, this can be accomplished with holes oriented substantially tangentially to the interior surface, such as within about 30 degrees. In some implementations, the angled main body holes 314 can be configured so that the incoming air does not pass through the long axis of the main body 302 and disrupt cool air flow represented by arrows 404. Instead, the incoming air can flow closer to the interior surface 318 and begin to rotate around the interior surface as indicated by arrows 402.

Figure 5:
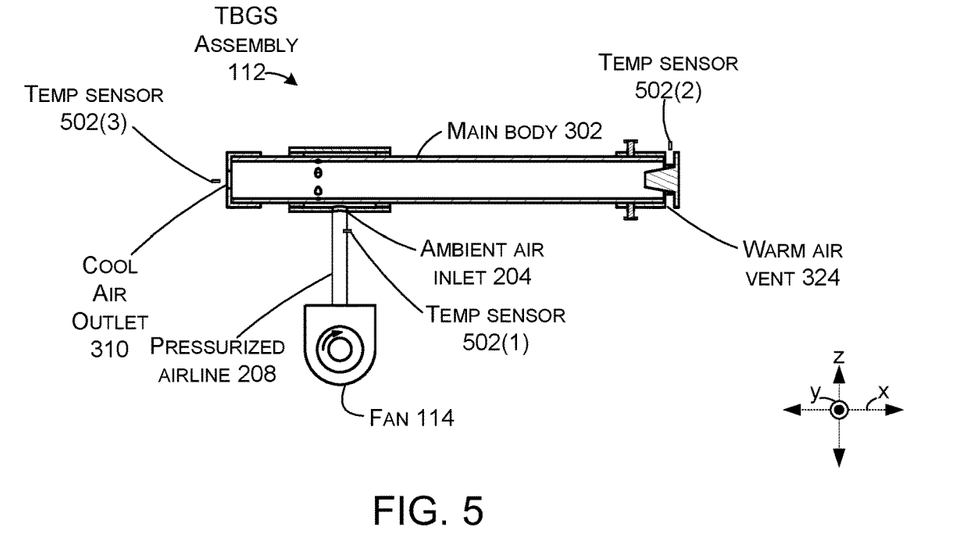

FIG. 5 shows a test configuration for temperature-based gas separation assembly 112. In this test configuration, temperature sensors 502 are employed to measure gas temperatures. Temperature sensor 502(1) is positioned to measure the temperature of air being received by the temperature-based gas separation assembly 112. Temperature sensor 502(2) is positioned to measure gas temperatures at the warm air vents 324 and temperature sensor 502(3) is positioned to measure gas temperatures at the cool air outlet 310. Testing was conducted at an ambient temperature of about 25 degrees Celsius. The fan 114 was off. Each of the temperature sensors 502 measured a temperature of approximately 25 degrees Celsius. Subsequently, the fan 114 was turned on and delivered pressurized (ambient) air through the airline 208 and into the ambient air inlet 204. The temperature measured by temperature sensor 502(1) remained approximately 25 degrees Celsius. Within a few seconds (e.g., less than five seconds), temperature sensor 502(2) measured air temperatures of about 27 degrees Celsius at the warm air vent 324 and temperature sensor 502(3) measured air temperatures of about 10 degrees Celsius at the cool air outlet 310. These measured temperatures remained generally constant while the fan 114 was on. All three temperatures quickly returned to about 25 degrees when the fan was turned off.

Similar results were obtained with other ambient temperatures. In one specific test, with the fan off all three measured temperatures were 25.6 degrees Celsius. Shortly after the fan was turned on, temperature sensor 502(1) measured 25.7 degrees Celsius, temperature sensor 502(2) measured 27.0 degrees Celsius, and temperature sensor 502(3) measured 9.8 degrees Celsius. Another test starting with approximately 35 degrees Celsius air showed a similar approximately 15-degree Celsius drop at temperature sensor 502(3) when the fan is turned on. Greater differentials can be achieved by adjusting air pressure and/or dimensions of the temperature-based gas separation assembly 112.

Figure 6:
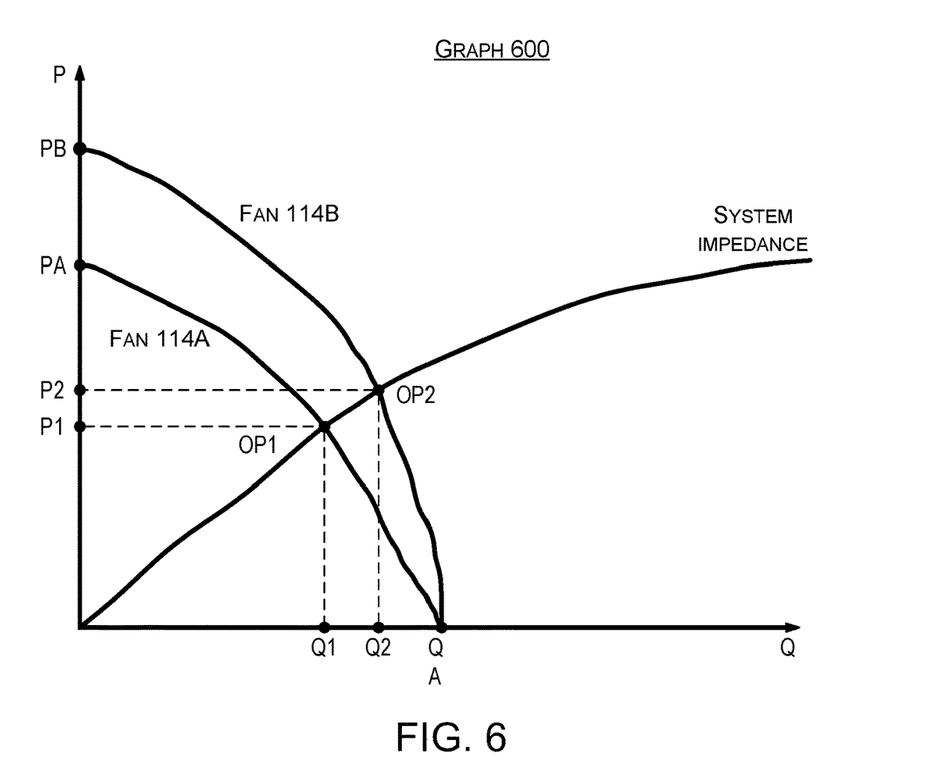
FIG. 6 shows a graph of example device parameters in accordance with some implementations of the present concepts.

FIG. 6 shows a graph 600 of parameters associated with pressurized air delivery to the temperature-based gas separation assembly 112. Graph 600 shows pressure (P) over airflow (Q). Fans 114 can be selected to provide higher pressure to increase the temperature differential. In this case, higher pressure tends to provide more airflow to the temperature-based gas separation assembly 112. Higher input pressure tends to produce a greater temperature delta (e.g., differential) between the warmer air emitted from the warm air vent and the cooler air emitted from the cool air outlet.

Graph 600 compares fan 114A and fan 114B. Fan 114B has higher air pressure (PB) than fan 114A (PA) even though both have the same airflow rate (QA). When the fan is installed into a system (e.g., coupled to the temperature-based gas separation assembly 112 via airline 208), there is an impedance due to airflow restrictions of the airline and the temperature-based gas separation structure. Thus, the operation point can be the intersection of the individual fan PQ and the system impedance curve.

From the graph 600, under a given system, fan 114B has operation point at OP2, and fan 114A has OP1. Accordingly, OP2 has air pressure P2 and airflow rate Q2, OP1 has air pressure P1 and airflow rate Q1, where it shows P2>P1, and Q2>Q1. This can indicate that the higher-pressure fan 114B can provide better thermal design because its airflow rate is increased by increasing air pressure alone. This provides a technical thermal solution, and with a higher air pressure in the system, it also provides even stronger air input to the temperature-based gas separation assembly 112, and the cooler air emitted from the temperature-based gas separation assembly 112 can be an even lower temperature. An individual fan can be selected for an individual device model based upon various thermal management parameters including, operating temperature of heat generating components, desired temperature of air utilized to cool the heat generating components, physical dimensions (e.g., airflow volumes, shapes, constrictions, etc.), number of temperature-based gas separation assemblies 112, etc.

The present temperature-based gas separation concepts can be utilized with any type of devices, such as but not limited to notebook computers, smart phones, wearable smart devices, tablets, desktops, gaming consoles, servers, and/or other types of existing, developing, and/or yet to be developed devices.

Temperature-based gas separation assemblies can be formed from various materials and/or utilizing various manufacturing techniques. For instance, temperature-based gas separation assemblies can be formed from various metals, polymers, such as plastics, composites, etc. Formation techniques can involve molding, machining, and/or additive (e.g., 3D printing), among others.

Various methods of manufacture, assembly, and/or use for these temperature-based gas separation assemblies are contemplated beyond those shown above relative to FIGS. 1A-6.

Although techniques, methods, devices, systems, etc., pertaining to devices and temperature-based gas separation assemblies are described in language specific to structural features and/or methodological acts, it is to be understood that the subject matter defined in the appended claims is not limited to the specific features or acts described. Rather, the specific features and acts are disclosed as example forms of implementing the claimed methods, devices, systems, etc.

Various examples are described above. Additional examples are described below. One example includes a device comprising a first portion comprising a first input device, a second portion comprising a second input device and a heat generating component, and a hinge assembly rotatably coupling the first and second portions and further comprising a temperature-based gas separation assembly positioned within the hinge assembly and configured to receive air from the device and to separate the air based upon temperature and to emit warmer air from one end of the temperature-based gas separation assembly and cooler air from an opposite end of the temperature-based gas separation assembly, the device being further configured to expel the warmer air and to direct the cooler air toward the heat generating component to cool the heat generating component.

Another example can include any of the above and/or below examples where the first input device comprises a touch display and the second input device comprises a touch display or wherein the first input device comprises a touch display and the second input device comprises a mechanical keyboard.

Another example can include any of the above and/or below examples where the heat generating component comprises a processor, a battery, a transformer, memory, or storage.

Another example can include any of the above and/or below examples where the device further comprises a fan that is configured to force the air into the temperature-based gas separation assembly.

Another example can include any of the above and/or below examples where the fan is configured to draw the air from inside the second portion and/or external to the device.

Another example can include any of the above and/or below examples where the temperature-based gas separation assembly comprises a main body that extends between a warm air adjuster and a cool air cap.

Another example can include any of the above and/or below examples where the warmer air is released radially from the warm air adjuster and the cooler air is released from a center of the cool air cap that is coextensive with a long axis of the main body.

Another example can include any of the above and/or below examples where the temperature-based gas separation assembly further comprises a structure that is configured to cause the air to enter the main body and rotate around the long axis.

Another example can include any of the above and/or below examples where the structure comprises angled main body holes that are angled tangentially to the main body.

Another example includes a device comprising a heat generating component positioned in a housing and a temperature-based gas separation assembly configured to receive ambient air and to separate the ambient air into warmer air that is directed outside the housing and cooler air that is directed inside the housing to cool the heat generating component.

Another example can include any of the above and/or below examples where the device further comprises a fan positioned in the housing and configured to force the ambient air into the temperature-based gas separation assembly at greater than ambient pressure.

Another example can include any of the above and/or below examples where the fan is positioned in an enclosure that also is sealed around an ambient air inlet of the temperature-based gas separation assembly or wherein the fan is coupled to the ambient air inlet by an airline.

Another example can include any of the above and/or below examples where the temperature-based gas separation assembly is positioned at least partially in the housing or wherein the temperature-based gas separation assembly is external to the housing.

Another example can include any of the above and/or below examples where the temperature-based gas separation assembly comprises a cylindrical main body that extends along a long axis between a warm air adjuster and a cool air cap.

Another example can include any of the above and/or below examples where the warmer air is released radially from the warm air adjuster and the cooler air is released from a center of the cool air cap that is coextensive with a long axis of the main body.

Another example can include any of the above and/or below examples where the warm air adjuster comprises a flattened face that is intersected by the long axis and that is generally perpendicular to the long axis and that is bounded by angled sides that angle away from the flattened face to warm air vents that are positioned radially between the main body and the warm air adjuster.

Another example includes an assembly that comprises a cylindrical main body that extends along a long axis, a separation structure positioned at a first end of the main body and defining a flattened face that that is generally perpendicular to the long axis and that is bounded by angled sides that angle away from the flattened face to warm air vents that are positioned radially around the main body, a cool air cap positioned on an opposite end of the main body and defining a cool air outlet that is coextensive with the long axis, and an ambient air housing configured to deliver pressurized air to an interim portion of the main body that contacts an interior surface of the main body and rotates around the long axis toward the separation structure.

Another example can include any of the above and/or below examples where the ambient air housing is configured to define a primary chamber around the main body.

Another example can include any of the above and/or below examples where the main body defines an angled main body hole between the primary chamber and a main chamber defined by the main body, and wherein the angled main body hole is configured to cause the air to contact the interior surface of the main body.

Another example can include any of the above and/or below examples where the angled main body hole comprises multiple angled main body holes that are radially arranged around the main body in the primary chamber.

The invention claimed is:

1. A device, comprising:
a first portion comprising a first input device;
a second portion comprising a second input device and a heat generating component; and,
a hinge assembly rotatably coupling the first and second portions and further comprising a temperature-based gas separation assembly positioned within the hinge assembly and configured to receive air from the device and to separate the air based upon temperature and to emit warmer air from one end of the temperature-based gas separation assembly and cooler air from an opposite end of the temperature-based gas separation assembly, the device being further configured to expel the warmer air and to direct the cooler air toward the heat generating component to cool the heat generating component.

2. The device of claim 1, wherein the first input device comprises a touch display and the second input device comprises a touch display or wherein the first input device comprises a touch display and the second input device comprises a mechanical keyboard.

3. The device of claim 1, wherein the heat generating component comprises a processor, a battery, a transformer, memory, or storage.

4. The device of claim 1, further comprising a fan that is configured to force the air into the temperature-based gas separation assembly.

5. The device of claim 4, wherein the fan is configured to draw the air from inside the second portion and/or external to the device.

6. The device of claim 5, wherein the temperature-based gas separation assembly comprises a main body that extends between a warm air adjuster and a cool air cap.

7. The device of claim 6, wherein the warmer air is released radially from the warm air adjuster and the cooler air is released from a center of the cool air cap that is coextensive with a long axis of the main body.

8. The device of claim 7, wherein the temperature-based gas separation assembly further comprises a structure that is configured to cause the air to enter the main body and rotate around the long axis.

9. The device of claim 8, wherein the structure comprises angled main body holes that are angled tangentially to the main body.

10. A device, comprising:
a heat generating component positioned in a housing; and,
a temperature-based gas separation assembly configured to receive ambient air and to separate the ambient air into warmer air that is directed outside the housing and cooler air that is directed inside the housing to cool the heat generating component.

11. The device of claim 10, further comprising a fan positioned in the housing and configured to force the ambient air into the temperature-based gas separation assembly at greater than ambient pressure.

12. The device of claim 11, wherein the fan is positioned in an enclosure that also is sealed around an ambient air inlet of the temperature-based gas separation assembly or wherein the fan is coupled to the ambient air inlet by an airline.

13. The device of claim 10, wherein the temperature-based gas separation assembly is positioned at least partially in the housing or wherein the temperature-based gas separation assembly is external to the housing.

14. The device of claim 10, wherein the temperature-based gas separation assembly comprises a cylindrical main body that extends along a long axis between a warm air adjuster and a cool air cap.

15. The device of claim 14, wherein the warmer air is released radially from the warm air adjuster and the cooler air is released from a center of the cool air cap that is coextensive with a long axis of the main body.

16. The device of claim 15, wherein the warm air adjuster comprises a flattened face that is intersected by the long axis and that is generally perpendicular to the long axis and that is bounded by angled sides that angle away from the flattened face to warm air vents that are positioned radially between the main body and the warm air adjuster.

17. An assembly, comprising:
a cylindrical main body that extends along a long axis;
a separation structure positioned at a first end of the main body and defining a flattened face that is generally perpendicular to the long axis and that is bounded by angled sides that angle away from the flattened face to warm air vents that are positioned radially around the main body;
a cool air cap positioned on an opposite end of the main body and defining a cool air outlet that is coextensive with the long axis; and,
an ambient air housing configured to deliver pressurized air to an interim portion of the main body that contacts an interior surface of the main body and rotates around the long axis toward the separation structure.

18. The assembly of claim 17, wherein the ambient air housing is configured to define a primary chamber around the main body.

19. The assembly of claim 17, wherein the main body defines an angled main body hole between the primary chamber and a main chamber defined by the main body, and wherein the angled main body hole is configured to cause the air to contact the interior surface of the main body.

20. The assembly of claim 19, wherein the angled main body hole comprises multiple angled main body holes that are radially arranged around the main body in the primary chamber.

* * * * *